US010659081B2

(12) United States Patent
Ikegawa et al.

(10) Patent No.: US 10,659,081 B2
(45) Date of Patent: May 19, 2020

(54) PREPROGRAMMED DATA RECOVERY

(71) Applicant: Everspin Technologies Inc., Chandler, AZ (US)

(72) Inventors: Sumio Ikegawa, Phoenix, AZ (US); Jon Slaughter, Albany, NY (US)

(73) Assignee: Everspin Technologies, Inc., Chandler, AZ (US)

(*) Notice: Subject to any disclaimer, the term of this patent is extended or adjusted under 35 U.S.C. 154(b) by 132 days.

(21) Appl. No.: 15/846,242

(22) Filed: Dec. 19, 2017

(65) Prior Publication Data
US 2018/0205396 A1 Jul. 19, 2018

Related U.S. Application Data

(60) Provisional application No. 62/446,197, filed on Jan. 13, 2017.

(51) Int. Cl.
H03M 13/29 (2006.01)
G11C 29/52 (2006.01)
G06F 11/10 (2006.01)
G06F 11/16 (2006.01)

(52) U.S. Cl.
CPC ..... *H03M 13/2906* (2013.01); *G06F 11/1048* (2013.01); *G06F 11/1068* (2013.01); *G06F 11/167* (2013.01); *G11C 29/52* (2013.01)

(58) Field of Classification Search
CPC .............. H03M 13/2906; G11C 29/52; G06F 11/1068; G06F 11/167; G06F 11/1048; G06F 11/008
See application file for complete search history.

(56) References Cited

U.S. PATENT DOCUMENTS

| 5,241,548 A * | 8/1993 | Dillon ............ G06F 11/08 714/822 |
| 6,044,487 A * | 3/2000 | Li ............... G06F 11/1435 714/5.1 |
| 7,339,819 B2 | 3/2008 | Johnson |
| 9,019,754 B1 | 4/2015 | Bedeschi |
| 9,140,747 B2 | 9/2015 | Kim et al. |
| 9,576,636 B1 | 2/2017 | Slaughter |
| 9,793,003 B2 | 10/2017 | Abedifard et al. |
| 2008/0282106 A1 | 11/2008 | Shalvi et al. |
| 2010/0251074 A1* | 9/2010 | Chu ............... G06F 11/1068 714/773 |

(Continued)

OTHER PUBLICATIONS

International Search Report and Written Opinion dated May 22, 2018 in International Application No. PCT/US2017/066980 (21 pages).

*Primary Examiner* — April Y Blair
*Assistant Examiner* — Rong Tang
(74) *Attorney, Agent, or Firm* — Bookoff McAndrews, PLLC

(57) ABSTRACT

Techniques for recovering preprogrammed data from non-volatile memory are provided that include majority voting and/or use of one or more levels of ECC correction. Embodiments include storage of multiple copies of the data where ECC correction is performed before and after majority voting with respect to the multiple copies. Multiple levels of ECC correction can also be performed where one level of ECC is performed at the local level (e.g. on-chip), whereas another level of ECC correction is performed at a system level.

14 Claims, 7 Drawing Sheets

(56) References Cited

U.S. PATENT DOCUMENTS

| | | |
|---|---|---|
| 2012/0198313 A1* | 8/2012 | Alam .................. G11C 11/1673 |
| | | 714/773 |
| 2013/0227200 A1 | 8/2013 | Cometti et al. |
| 2016/0064058 A1 | 3/2016 | Janesky et al. |

* cited by examiner

PREPROGRAMMED DATA RECOVERY

CROSS-REFERENCE TO RELATED APPLICATIONS

This application claims the benefits of priority to U.S. Provisional Application No. 62/446,197, filed on Jan. 13, 2017, the entirety of which is herein incorporated by reference.

TECHNICAL FIELD

The disclosure herein relates generally to memory, and, more particularly to recovering preprogrammed data in such memory after operations that can compromise the validity of the preprogrammed data.

BACKGROUND

In many applications it is desirable to store data during memory device manufacturing in order to later utilize that preprogrammed data in a system in which the memory device is included. For example, preprogrammed data can be stored in nonvolatile memory devices during manufacturing, where the preprogrammed data is later retrieved by a processor or other entity in a system that includes the nonvolatile memory devices and used for operations such as startup or initialization. Similarly, in single-chip environments, preprogrammed data can be stored in nonvolatile memory embedded on the chip and then later used by logic circuitry or other circuitry on the chip when the chip is later included in a system.

Preprogramming data in nonvolatile memory during manufacturing is relatively straightforward as the conditions are present to enable such programming during testing operations such as wafer probe or burn-in. However, such preprogrammed data can be put in jeopardy during subsequent manufacturing operations. For example, soldering a finished integrated circuit onto a printed circuit board using reflow soldering techniques can expose the integrated circuit to temperatures on the order of 260° C. Such elevated temperatures can cause degradation of stored memory states, thereby potentially corrupting the preprogrammed data stored earlier in the manufacturing process.

For example, in the context of magnetoresistive memory devices, exposure to such elevated temperatures can degrade the magnetic states used to store the preprogrammed data, thereby resulting in undesirable data loss. Magnetoresistive memory devices store information with magnetic states that result in different device resistances. For example, in certain magnetoresistive memory devices, the resistance across a magnetic tunnel junction (MTJ), and therefore the voltage drop for a specific current, depends on the relative magnetic states of the magnetic layers within the memory cell. In such memory devices, there is typically a portion of the memory cell that has a "reference" magnetic state and another portion that has a "free" magnetic state that is controlled to be either parallel or antiparallel to the reference magnetic state. Because the resistance through the memory cell changes based on whether the magnetic state of the free portion is parallel or antiparallel to the magnetic state of the reference portion, information can be stored by setting the magnetic orientation of the free portion. The information is later retrieved by sensing the orientation of the free portion. Such magnetic memory devices are well known in the art.

Similarly, other memory devices exist that store data in ways that can be compromised by exposure to heat or other adverse conditions presented by the manufacturing processes. For example, other forms of resistive memory store data based on the state of the materials included within the memory device, where the state of those materials can be impacted by exposure to the heat associated with reflow soldering. One example includes state change memory in which data is stored based on whether a layer of material is in an amorphous state. While the effects of such exposure to heat may not cause total loss of data in the memory affected, some subset of the bits included in the memory can be compromised, thereby resulting in undesirable errors in the overall data set.

As such, there is a need for techniques to allow preprogrammed data to the stored in such memory devices and later reliably recovered after the memory is exposed to adverse conditions, including the heat associated with soldering operations and/or packaging.

DETAILED DESCRIPTION

Figure 1:
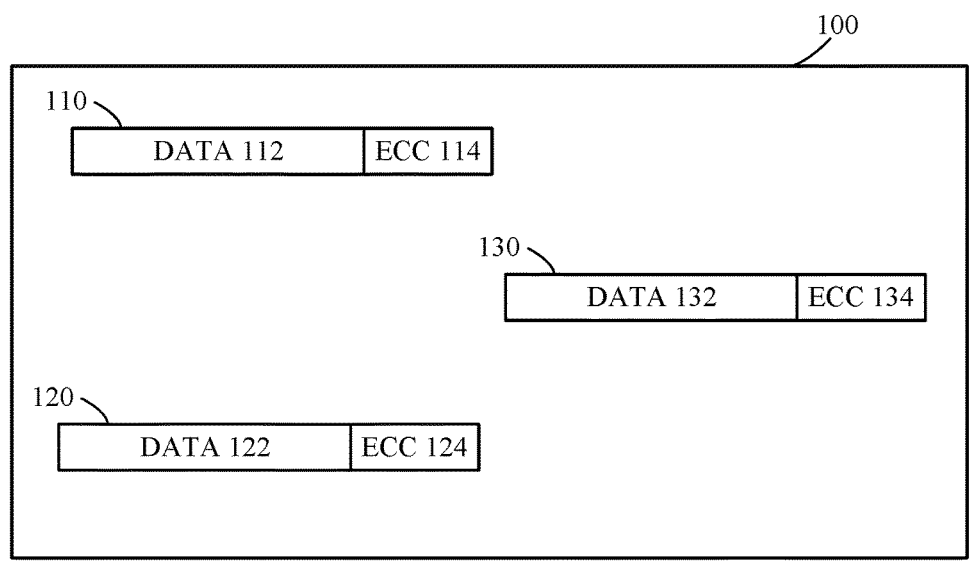
FIG. 1 is a block diagram showing distributed redundant data storage in a memory in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the operation of standard magnetic random access memory (MRAM), use of error correction codes to correct data sets, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Non-volatile memory, examples of which include magnetoresistive memory, state-change memory, FLASH memory, and ferroelectric memory is non-volatile in the sense that once a data bit is stored in a memory cell, removal of power to the memory will not result in the data being lost. In some instances, it is desirable to store data within a nonvolatile memory during production for later use in a system. For example, a memory may be preprogrammed during manufacturing, where the information stored on the memory is later used after the memory is placed within a system. The pre-programming performed during manufacturing may occur during testing (e.g., wafer probe or burn-in) when the memory is already being exercised, and therefore a separate programming operation is unnecessary. Such preprogramming can help reduce overall system manufacturing costs.

While it is sometimes desirable to preprogram memory devices during manufacturing, such preprogrammed data can sometimes be lost due to operations that occur after such preprogramming. For example, in the case of magnetic memories, exposure to magnetic fields, high temperatures, or other conditions can disrupt the magnetic state of the free portions of the memory cells. For example, the high temperatures associated with soldering operations when a device is mounted to a printed circuit board can result in the loss of such preprogrammed data. More specifically, solder reflow operations expose the device to temperatures on the order of 260° C., which can lower the energy barrier of the free layer and allow it to unintentionally change state, thereby corrupting the information stored in the free layer.

The memory cells in a magnetic memory device can be designed in order to increase the robustness with which such memory cells are able to retain data during manufacturing operations that expose such memory devices to adverse conditions. However, there is a trade-off between the data retention capability of the memory cell and the ease with which the state of the memory cell can be changed during a normal write operations to the memory cell. For example, the thickness or composition of the various layers making up the magnetic tunnel junction in a magnetic memory cell can be changed in order to allow for better data retention when exposed to magnetic fields or heat. However, the thicker layers typically result in a larger energy barrier, such that switching the free layer of the magnetic tunnel junction requires a higher voltage. During normal operation, having a higher energy barrier and requiring higher switching voltages can result in earlier breakdown of the memory cells and less reliable writing operations.

Based on this trade-off, the structure of the magnetic memory cells can be designed in order to achieve reasonably reliable data storage through the manufacturing process (a tolerable raw bit error rate (BER)) while preserving the general ease with which the free layer can be switched during normal operation. Designing the magnetic memory cells in such a manner presents the risk that some data bits will be compromised during manufacturing based on the raw BER. Techniques are presented herein to allow such preprogrammed data to be reliably recovered such that the memory cells can be engineered to have desirable switching characteristics during normal operation. As discussed in additional detail below, such techniques include storing multiple copies of the data in different portions of individual memory devices, or in different memory devices within a system. Majority voting schemes and the use of error correction codes are used to reliably recover the preprogrammed data which can then be used by the system in which the memory storing the preprogrammed data is included.

While some of the embodiments described herein focus on recovery of data stored in the free layer of magnetic tunnel junctions in magnetic memory cells, the techniques can also be used in conjunction with storage of data in the reference layers of magnetic tunnel junctions. Related U.S. patent application Ser. No. 15/087,469 entitled "MAGNETIC MEMORY HAVING ROM-LIKE STORAGE AND METHOD THEREFORE," which is assigned to the same assignee as the present application, provides additional details regarding storage and retrieval of data using the reference layers of magnetic tunnel junctions. Similarly, related U.S. patent application Ser. No. 62/439,183 entitled "DATA STORAGE IN SYNTHETIC ANTIFERROMAGNETS INCLUDED IN MAGNETIC TUNNEL JUNCTIONS," which is assigned to the same assignee as the present application, provides even further details regarding storage and retrieval of data using the reference layers of magnetic tunnel junctions. Application Ser. No. 15/087,469 and 62/439,183 are incorporated by reference herein in their entirety, and any of the embodiments described herein may be implemented or employed in conjunction with the embodiments described in those applications.

FIG. 1 illustrates memory 100 that stores three data groups 110, 120, and 130. In some embodiments, the memory 100 is a single integrated circuit memory device such as an MRAM memory device. In other embodiments, the memory 100 is a group of memory devices where each memory device is on a separate integrated circuit or chip. Each of the data groups 110, 120, and 130 is originally preprogrammed in the memory to represent duplicate copies of the same data group. In other words, there are multiple copies of the data stored in the memory 100 to provide redundancy. Thus, when originally preprogrammed, each of the data groups 110, 120, and 130 is identical in terms of the bits included within the data group. While FIG. 1 shows three copies of the data group being stored within the memory 100, other embodiments store more than three copies of the same data group in different locations within the memory 100. For example, 5, 7, 9, 11, 13, 15, or more copies of the same data group can be stored within the memory 100.

Each data group includes a data portion that includes a plurality of data bits as well as a set of error correction code (ECC) information, where the ECC information in each data group is determined based on the plurality of data bits included in that data group and can be used to correct errors in the plurality of data bits included in that data group. As is shown, data group 110 includes data 112 and ECC information 114. Similarly, data group 120 includes data 122 and ECC information 124, while data group 130 includes data 132 and ECC information 134. While all the bits included in the data groups 110, 120, and 130 are initially identical after being preprogrammed, following subsequent manufacturing operations that expose the memory 100 to adverse conditions, some of the bits within one or more of the data groups can be corrupted such that the stored bits within a single data group may not correspond to the bits originally programmed.

Figure 2:
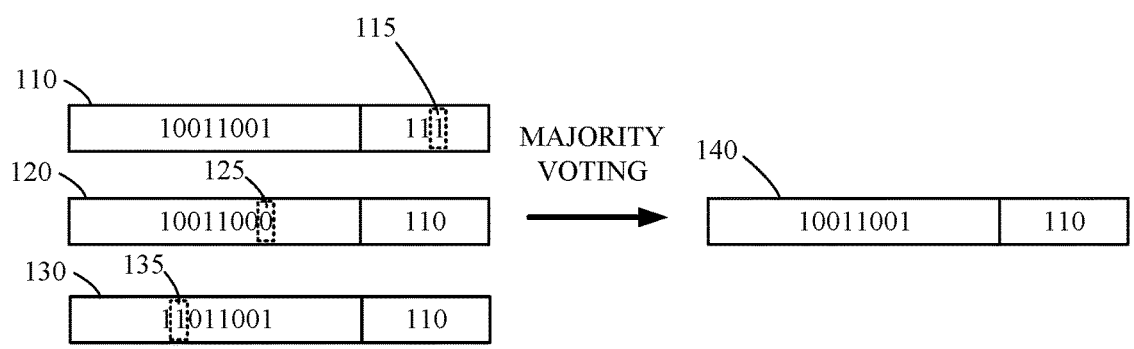
FIG. 2 is a block diagram showing application of a majority voting scheme in accordance with exemplary embodiments.

Some of the embodiments described herein utilize majority voting schemes in order to leverage redundant copies of the data to recover preprogrammed data. FIG. 2 illustrates an example of a majority voting scheme used to generate a majority data group 140 from three data groups 110, 120, and 130 that were originally stored as redundant copies of the data group attempting to be recovered. As shown in FIG. 2, each of the data groups 110, 120, and 130 has a single bit error in the bits making up the data group. In data group 110, the last bit 115 in the ECC information has switched from a "0" to a "1". Similarly, in data group 120, the last bit 125 in the data portion has switched from a "1" to a "0". In the data group 130, the second bit 135 in the data portion has switched from a "0" to a "1". The majority voting scheme compares each bit in each data group with the corresponding bits in the other data groups and selects a bit value for each bit location corresponding to the majority state of the bits in the different data groups. In the case of three data groups, if at least two of the bits are the same, that is the majority state of the bits in that location. For example, the majority state for the last bit in the ECC portion of the data group is a "0" based on both data groups 120 and 130 having a "0" in that bit location while data group 110 has a "1" in that location. The error in data group 110 is outvoted by the corresponding bits in data groups 120 and 130. As one of ordinary skill in the art appreciates, there are many logic circuits that can implement majority voting schemes. In some embodiments, after the data is read from the multiple redundant locations a processor performs the operations associated with majority voting. While majority voting provides a way to compare multiple redundant copies of the same data groups stored in memory, the error correction provided by such majority voting schemes is often not sufficient to provide the level of reliability needed to recover important data associated with system startup or other system-critical operations.

In order to augment the benefits provided by a majority voting scheme, the ECC information included for each data group can also be leveraged to correct errors that have occurred. As discussed below, such ECC information can be leveraged either before a majority voting scheme is applied. The ECC information included with each data group can be considered local ECC information and may be the same type of ECC information stored with data in the non-volatile memory during normal operations.

Figure 3:
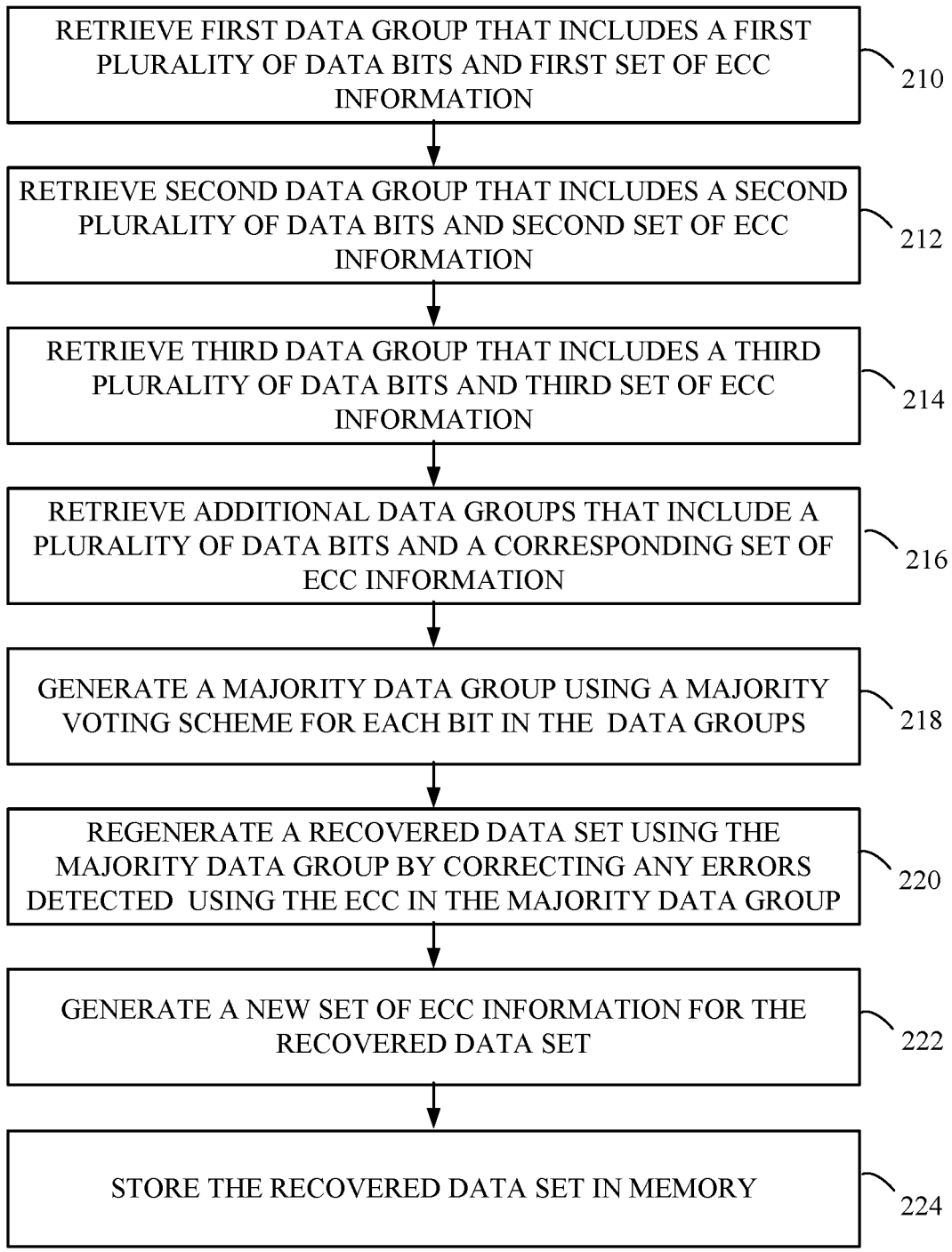
FIGS. 3 and 4 are flow charts illustrating methods for recovering preprogrammed data stored in memory cells in accordance with exemplary embodiments.
Figure 4:
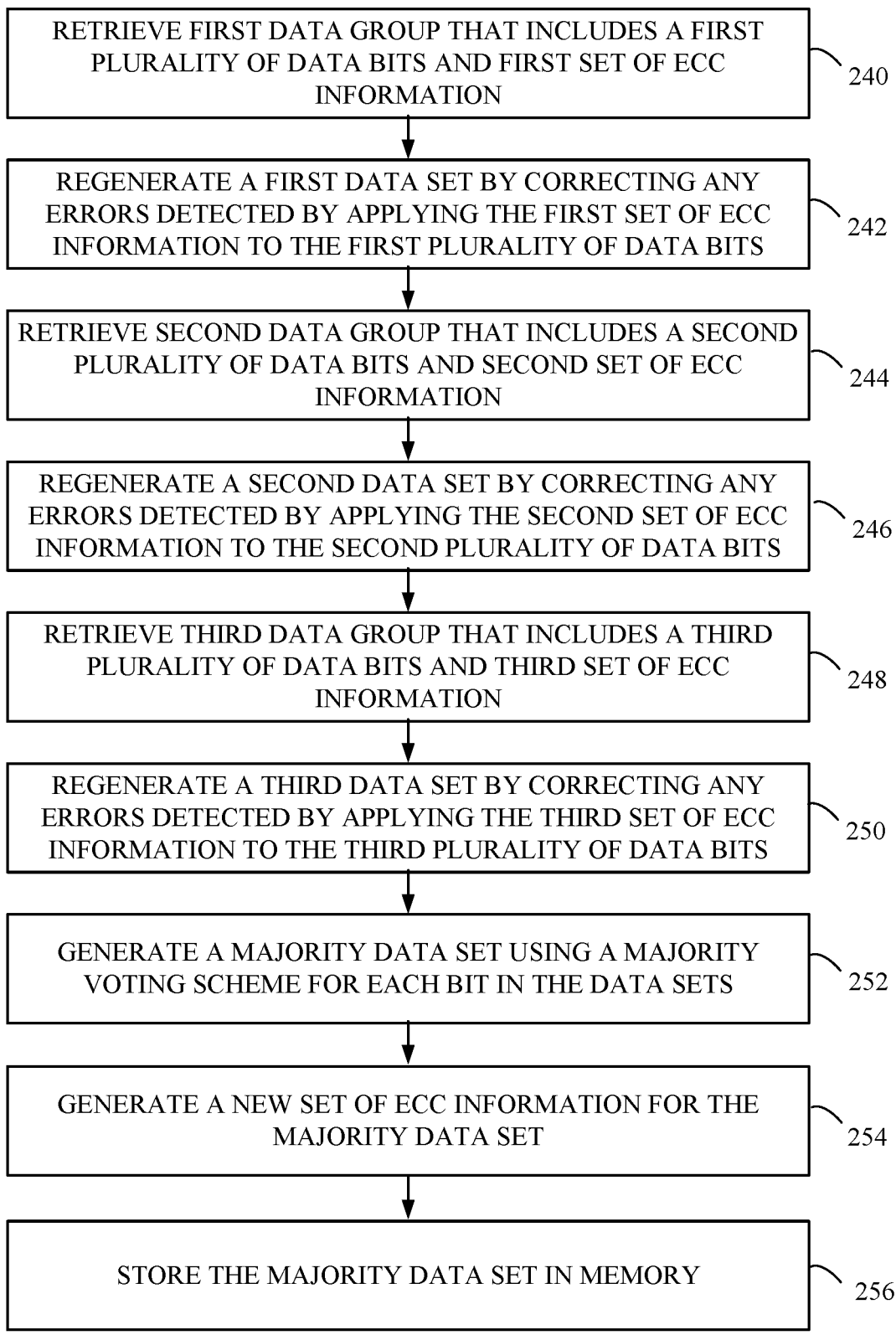

FIGS. 3 and 4 are flow charts that illustrate exemplary embodiments of methods of recovering preprogrammed data stored in memory cells, where, in some embodiments, the data is stored in the orientation of the magnetic moment of the free layers in magnetic memory devices. The operations included in the flow charts may represent only a portion of the overall process used in recovering the data. For illustrative purposes, the following description of the methods in FIGS. 3 and 4 may refer to elements mentioned above in connection with FIGS. 1 and 2. It should be appreciated that methods may include any number of additional or alternative tasks, the tasks shown in FIGS. 3 and 4 need not be performed in the illustrated order unless specified otherwise, and the methods may be incorporated into a more comprehensive procedure or process having additional functionality not described in detail herein. Moreover, one or more of the tasks shown in FIGS. 3 and 4 can be omitted from an embodiment as long as the intended overall functionality remains intact.

FIG. 3 illustrates a flow chart of a method for recovering preprogrammed data stored in memory cells in which majority voting precedes ECC correction. In some embodiments, the preprogrammed data is data stored in nonvolatile memory cells during manufacturing operations such as wafer probe or burn-in. While some embodiments preprogram multiple redundant copies of the data in multiple locations within a single memory device (e.g. in different rows, banks, or arrays within the memory device), in other embodiments multiple redundant copies of the data are stored in separate memory devices (e.g. different chips).

At 210 a first data group is retrieved from memory. The first data group includes a first plurality of data bits in a first set of ECC information. At 212 a second data group is retrieved, where the second data group includes a second plurality of data bits and a second set of ECC information. As noted above, the second data group can be stored in a different array or different location within the same array within a single memory device, or in other embodiments the second data group is stored on a different integrated circuit. At 214 a third data group that includes a third plurality of data bits in a third set of ECC information is retrieved. As discussed above with respect to FIG. 1, each of the first, second, and third data groups represents a redundant copy of the data group originally stored as preprogrammed data. While many of the embodiments described herein are discussed in the context of using three redundant data groups, it should be appreciated that many more redundant copies of a particular data group can be stored in the memory. As such, any additional data groups, each of which would include a plurality of data bits and a corresponding set of ECC information, are retrieved at 216.

At 218 a majority data group is generated from the data groups retrieved from memory. The majority data group generated at 218 is generated using a majority voting scheme such as that described with respect to FIG. 2. Thus, the individual bits in each of the data groups that have been retrieved from memory are compared with their corresponding bits in the other data groups in a majority voting scheme in order to arrive at a majority data group where each bit within the majority data group represents the result of the majority voting performed for that particular bit location. For each bit in the plurality of data bits in the majority data group the bit is determined based on a majority voting scheme using a corresponding bit from each of the first, second, and third pluralities of data bits as well as any corresponding bits from any additional data groups retrieved at 216. Similarly, each bit in the set of ECC information in the majority data group is determined based on a majority voting scheme using a corresponding bit from each of the first, second, and third sets of ECC information as well as any corresponding bits in any additional data groups retrieved at 216. As a result, the majority data group will include a plurality of data bits and a set of ECC information. For example, the data group 140 shown in FIG. 2 is representative of a majority data group generated using the data groups 110, 120, and 130 retrieved from the memory 100.

At 220 a recovered data set is regenerated using the majority data group by applying the set of ECC information in the majority data group to the plurality of data bits in the majority data group to correct any errors detected. Thus, after using the majority voting scheme to arrive at a majority data group, the ECC information included in the majority data group is used to detect and correct any errors within the data bits in the majority data group. This additional level of error detection and correction helps to further reduce the effect of any errors that may have occurred to bits in the redundant copies of the preprogrammed data during operations that occur following such preprogramming.

The ECC information stored with each of the data groups can include a variety of different error correction information corresponding to different error correction schemes that are known in the art. For example, in one embodiment, the ECC information includes at least one parity bit, where parity bits are used to represent even or odd parity of the plurality of data bits within the data group. In other embodiments, the ECC information includes Hamming code information, including one or more of Hamming code corresponding to single error correction based on a 128-bit word length, single error correction based on a 64-bit word length, double error correction corresponding to 128-bit word length, and double error correction corresponding to a 64-bit word length. Parity bits and Hamming codes are ECC techniques that are often used in conjunction with data storage and retrieval during normal memory operations, and such ECC techniques can be referred to as first-level ECC techniques. Such first-level ECC techniques can be readily implemented on the same integrated circuit with the data and, therefore, the data recovery using such ECC techniques can be done completely on-chip.

In other embodiments, aspects of the error correction using the ECC information are performed elsewhere in the system (i.e. off-chip). For example, more complex error correction schemes such as Reed-Solomon coding, Bose-Chaudhuri-Hocquenghem (BCH) coding, Low-Density Parity-Check (LDPC) coding, or Memory Signal Processing (MSP) can be used to further enhance the recovery of the preprogrammed data. Such more complex error correction schemes can be referred to as second-level ECC methods, where, in some embodiments, such methods are only used to recover the preprogrammed data and would not also be used with normal read/write operations in the memory. Moreover, such second-level ECC methods may be performed at a system level, where data is retrieved from multiple memory devices and the second-level ECC correction is performed by a central entity, such as a processor or other control circuit. While such second-level ECC schemes are more complex than the first-level ECC schemes mentioned above, if data integrity in a single integrated circuit system is important, the added complexity and cost of such second-level ECC schemes can be applied and used in a single chip system.

After the recovered data set is regenerated at 220, a new set of ECC information for the recovered data set is generated at 222. Thus, once the plurality of data bits within the recovered data set have been successfully recovered, new ECC information for those data bits can be generated such that any subsequent errors to that data can be detected and corrected. The ECC information generated at 222 may be the same type of ECC information used to recover the data set at 220, or some other ECC correction scheme.

At 224 the recovered data set, as well as any new ECC information generated at 222, is stored in memory. In some embodiments the recovered data set is stored back into the same memory from which the redundant data groups were retrieved, whereas in other embodiments the recovered data set is stored into other memory, such as volatile memory or other nonvolatile memory. Thus, once recovered, the preprogrammed data is rewritten into a location within the system allowing it to be used for its intended purpose. Such writing may be accomplished using normal writing techniques used to write data to the memory during normal operation. In some embodiments, the preprogrammed data may correspond to boot code or other start-up information leveraged by a processor for system initialization.

In such embodiments, the processor may look to a specific memory location either in volatile or nonvolatile memory for that start-up data. As such, following recovery of the preprogrammed data the data can be stored in that location in order to enable the processor to perform the start-up operations. In some embodiments, the data is stored in RAM (e.g. DRAM, SRAM, MRAM, etc.) using the writing techniques used to store data in such RAM during normal operations. In examples where the memory in which the data stored is non-volatile, the data recovery can be a one-time operation that avoids potential errors that can be created by operations such as solder reflow.

FIG. 4 illustrates a flow chart of an alternate method for recovering preprogrammed data stored in memory cells. As was the case with respect to the method of FIG. 3, some embodiments preprogram multiple redundant copies of the data in multiple locations within a single memory device whereas in other embodiments multiple redundant copies of the data are stored in separate discrete memory devices. The method of FIG. 4 differs from that of FIG. 3 and that the ECC information stored with each data group is used to correct any detectable errors within the data group before a majority voting scheme is applied to the data in the data groups.

At 240 a first data group is retrieved from the memory. The first data group includes a first plurality of data bits in a first set of ECC information. At 242 a first data set is regenerated by correcting any detectable errors within the first plurality of data bits using the first set of ECC information. For example, if the ECC information for the first plurality of data bits reveals a particular bit has inadvertently changed state, that error is corrected at this stage. The first data set corresponds to the first plurality of bits from the first data group with any ECC correctable errors corrected.

At 244 a second data group is retrieved, where the second data group includes a second plurality of data bits and a second set of ECC information. As noted above, the second data group can be stored in a different array or different location within the same array within a single memory device, or, in other embodiments, the second data group is stored on a different integrated circuit. At 246 a second data set is regenerated by correcting any detectable errors within the second plurality of data bits using the second set of ECC information. At 248 a third data group that includes a third plurality of data bits in a third set of ECC information is retrieved, and at 250 a third data set is regenerated by correcting any detectable errors within the third plurality of data bits using the third set of ECC information. As discussed above with respect to FIG. 1, each of the first, second, and third data groups represents a redundant copy of the data group originally stored as preprogrammed data. While the embodiment illustrated in FIG. 4 is presented in the context of three data groups, many more redundant copies of a particular data group can be stored in the memory and used together with the first three data groups in the recovery of the preprogrammed data.

At 252 a majority data set is generated using a majority voting scheme for each bit in the data sets generated at 242, 246, and 248. Thus, after ECC correction of any errors within the data groups has occurred, the resulting data sets are merged through majority voting to create a majority data set. Each bit in the majority data set is determined based on a majority vote amongst the corresponding bits in the different data sets. While the method of FIG. 3 perform such majority voting before doing ECC correction, the method of FIG. 4 first does the ECC correction and then performs majority voting to arrive at a majority data set. In the embodiment of FIG. 4, the majority data set determined at 252 corresponds to the recovered data set of FIG. 3 in that both are the end result of the error correction operations performed by the respective methods.

At 254 a new set of ECC information is generated for the majority data set. At 256, the majority data set, and any newly generated ECC information corresponding to the majority data set, is stored in memory. As was the case with the method of FIG. 3, the end result data recovered using the method of FIG. 4 can be stored in the same memory chip(s) or memory array(s) from which the first, second, and third data groups were retrieved. In other embodiments, the majority data set recovered can be stored in other memory for use by the various circuits included in the system in which the memory is being used.

As was discussed above with respect to FIG. 3, the ECC information included in the data groups retrieved in the method of FIG. 4 can include first-level ECC information or second-level ECC information as those terms were described above. Moreover, the ECC information generated prior to storing the recovered majority data set can also include first- and/or second-level ECC information.

Figure 5:
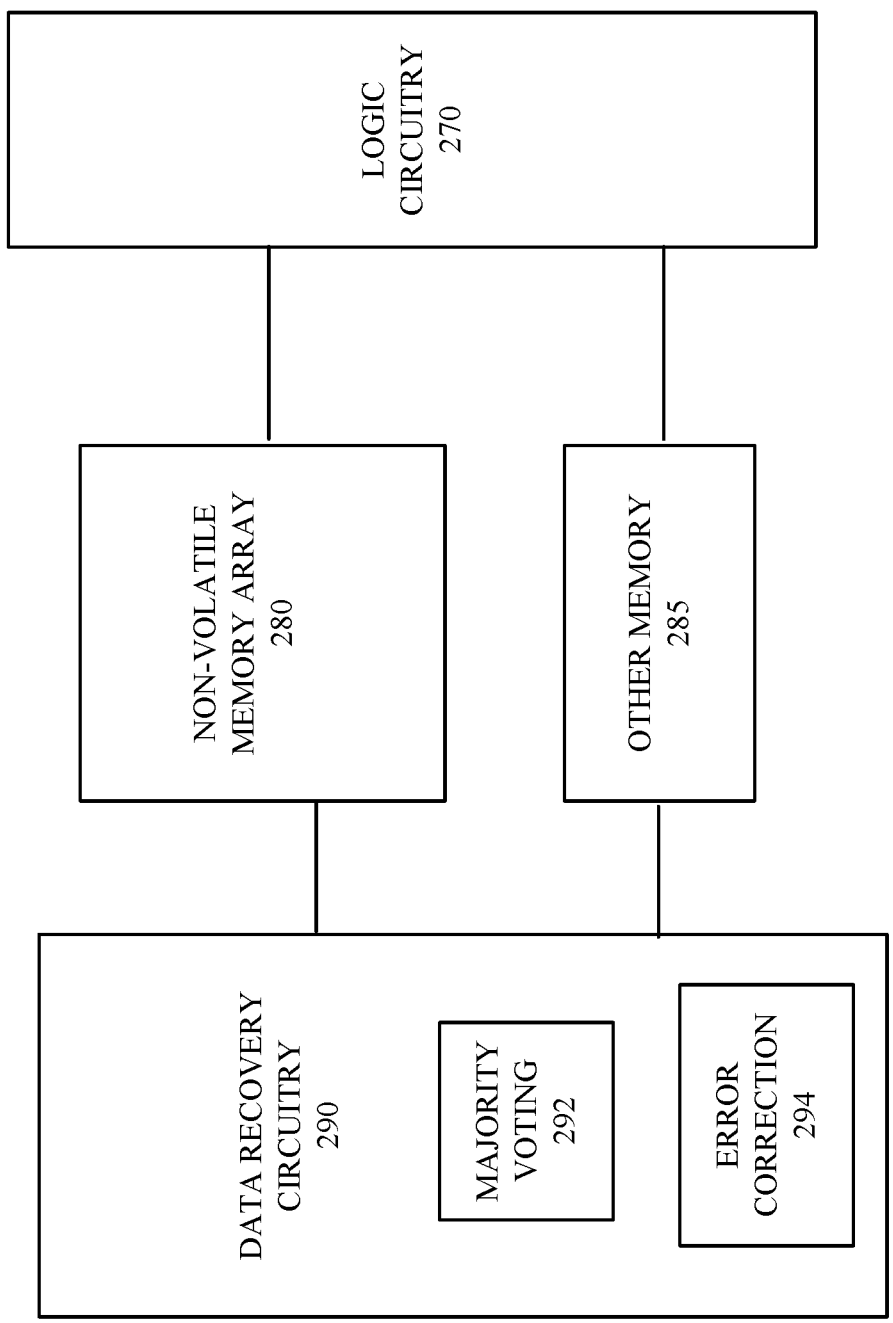
FIG. 5 is a block diagram showing circuitry used for preprogrammed data recovery in accordance with exemplary embodiments.

FIG. 5 illustrates a block diagram of a system 260 in which preprogrammed data initially stored in the nonvolatile memory array 280 is recovered for use within the system. In some embodiments the nonvolatile memory array 280 is an array of magnetic memory cells arranged in rows and columns on an integrated circuit with the rest of the system 260. In examples of such embodiments, each magnetic memory cell includes a magnetic tunnel junction coupled in series with a selection transistor. In other embodiments, the nonvolatile memory array 280 includes other types of memory cells that may be susceptible to degradation during manufacturing such that data recovery efforts can be beneficial in regenerating preprogrammed data stored in those memory cells. In yet other embodiments, the nonvolatile memory array 280 is dispersed over multiple integrated circuits, where different portions of the nonvolatile memory array are included in each of those circuits. For example, the nonvolatile memory array 280 could be a plurality of MRAM memory devices included on a printed circuit board.

The preprogrammed data is initially stored at multiple locations in the nonvolatile memory array 280, where the level of redundancy can be determined based on a desired bit error rate (BER) for the preprogrammed data within the system combined with an expected raw BER for the memory cells after manufacturing operations are complete. In order to achieve a lower bit error rate, more redundant copies of the preprogrammed data can be included in the nonvolatile memory array 280.

Data recovery circuitry 290 is coupled to the nonvolatile memory array 280. The data recovery circuitry 290 can include majority voting circuitry 292 that can perform the majority voting operations with respect to bits in the preprogrammed memory array such as those discussed above with respect to FIGS. 2-4. Similarly, data recovery circuitry 290 can include error correction circuitry 294 that is able to utilize ECC information stored within the groups of data corresponding to the preprogrammed data in order to correct any ECC-correctable errors within each of those data groups. The error correction processing performed by the error correction circuitry 294 can include first-level error correction operations and/or second-level error correction operations, where first-level error correction operations include error correction operations associated with parity bits or Hamming codes, and second-level error correction operations include more complex error correction operations such as Reed-Solomon coding, Bose-Chaudhuri-Hocquenghem (BCH) coding, Low-Density Parity-Check (LDPC) coding, or Memory Signal Processing (MSP).

The data recovery circuitry 290 is configured to retrieve multiple data groups from the nonvolatile memory array 280, where each data group retrieved from the nonvolatile memory array 280 includes a plurality of data bits and a corresponding set of ECC information. Each data group represents the preprogrammed data, or a portion of the preprogrammed data, that is to be recovered. After retrieving the multiple data groups from memory, the data recovery circuitry 290 performs majority voting and error correction operations on the data groups to recover the preprogrammed data. After the preprogrammed data is recovered, the data recovery circuitry 290 can generate new ECC information for the data that has been recovered prior to storing the data and any new ECC information back to memory. The data recovery circuitry 290 can store the recovered data and accompanying ECC information back into the nonvolatile memory array 280, or, in other embodiments, the data recovery circuitry 290 stores the recovered data in other memory 285.

In some embodiments, logic circuitry 270 is included in the system 260 and utilizes the recovered preprogrammed data. Examples of embodiments that do not include logic circuitry 270 are standalone memory devices that are able to regenerate preprogrammed data prior and store that regenerated data for use by devices accessing the memory devices. In other embodiments, logic circuitry 270 is a processor or other processing entity that relies on the preprogrammed data for startup or other initialization operations.

Figure 6:
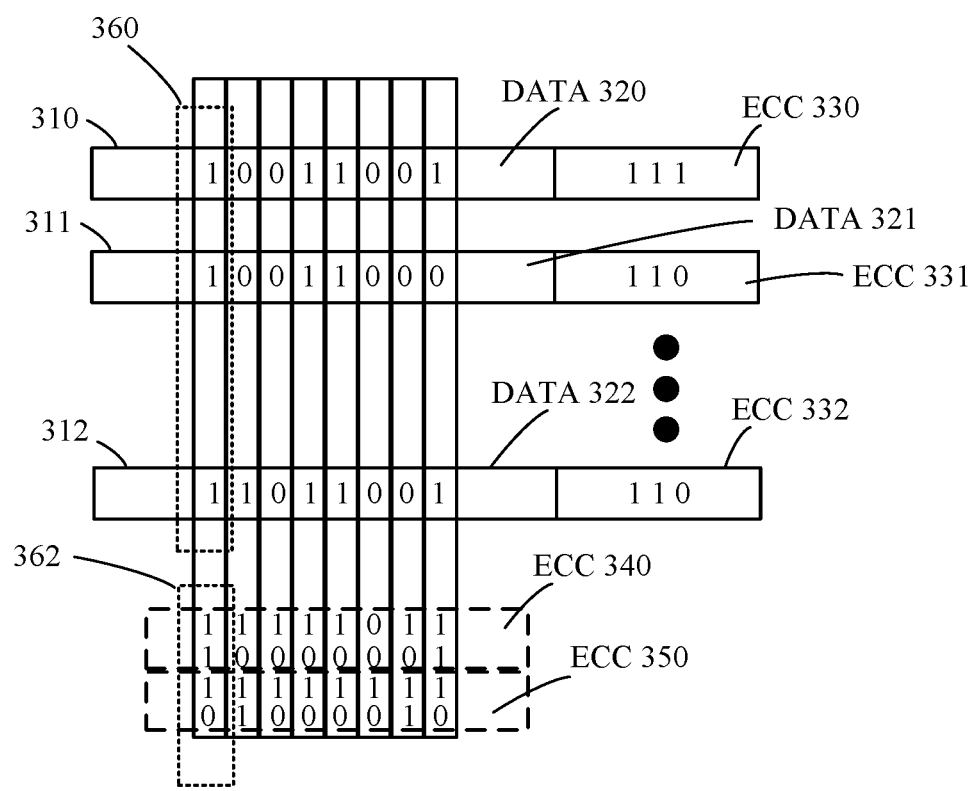
FIG. 6 is a block diagram showing data sets and data groups used in the recovery of preprogrammed data in accordance with another exemplary embodiment.

FIG. 6 corresponds to a block diagram that helps illustrate more complex techniques for recovering preprogrammed data stored in one or more memory devices. In the example shown in FIG. 6, each data group in a plurality of data groups 310-312 includes a corresponding plurality of data bits 320-322 and a corresponding set of ECC information 330-332. In one embodiment, each of the data groups is stored on a separate memory device, whereas in other embodiments, some or all of the data groups are stored on the same memory device. Additional ECC information 340 and 350 can be stored on one of the same memory devices as the data groups 310-312, or, in other embodiments, stored on one or more additional memory devices.

In the preprogrammed data recovery scheme associated with FIG. 6, two levels of ECC correction are performed. A first-level ECC operation, which, for example, may include parity or Hamming code correction, is performed for each of the data groups 310-312 based on the ECC information 330-332 included in each of those data groups. In multi-memory device embodiments, these first-level ECC correction operations can be performed on the individual memory devices. In other embodiments, the first-level ECC correction is performed by a central circuit (e.g. a processor) rather than on the individual memory devices. In yet other embodiments, the ECC information 330-332 corresponds to second-level, or a combination of first- and second-level, ECC information.

After the initial ECC correction performed based on the ECC information 330-332, further ECC correction is performed based on different groupings of the bits within the plurality of data groups 310-312. For example, vertical slices of data such as the group 360 (illustrated using a dotted box) are combined and evaluated using a portion 362 of the ECC information 340 and 350. For example, in some embodiments the first ECC operations performed using the ECC information 330-332 corresponds to first-level ECC correction, and the second ECC operations performed using ECC information 340 and 350 corresponds to second-level ECC correction. Providing such two-level ECC correction and distributing the data across multiple integrated circuits can help to ensure better recovery of the preprogrammed data. As noted above, all of the operations described with respect to FIG. 6 can be implemented on a single integrated circuit rather than in a distributed system that includes multiple integrated circuits.

In addition to the two levels of ECC correction performed in the technique illustrated in FIG. 6, majority voting can also be included to further enhance the accuracy of the data recovery. For example, each of the data groups 310-312 may be stored in multiple locations within a single memory device and majority voting can be used to determine the majority data group for that memory device. As discussed above with respect to FIGS. 3 and 4, the first ECC correction can be performed before or after such majority voting takes place on the memory device.

Figure 7:
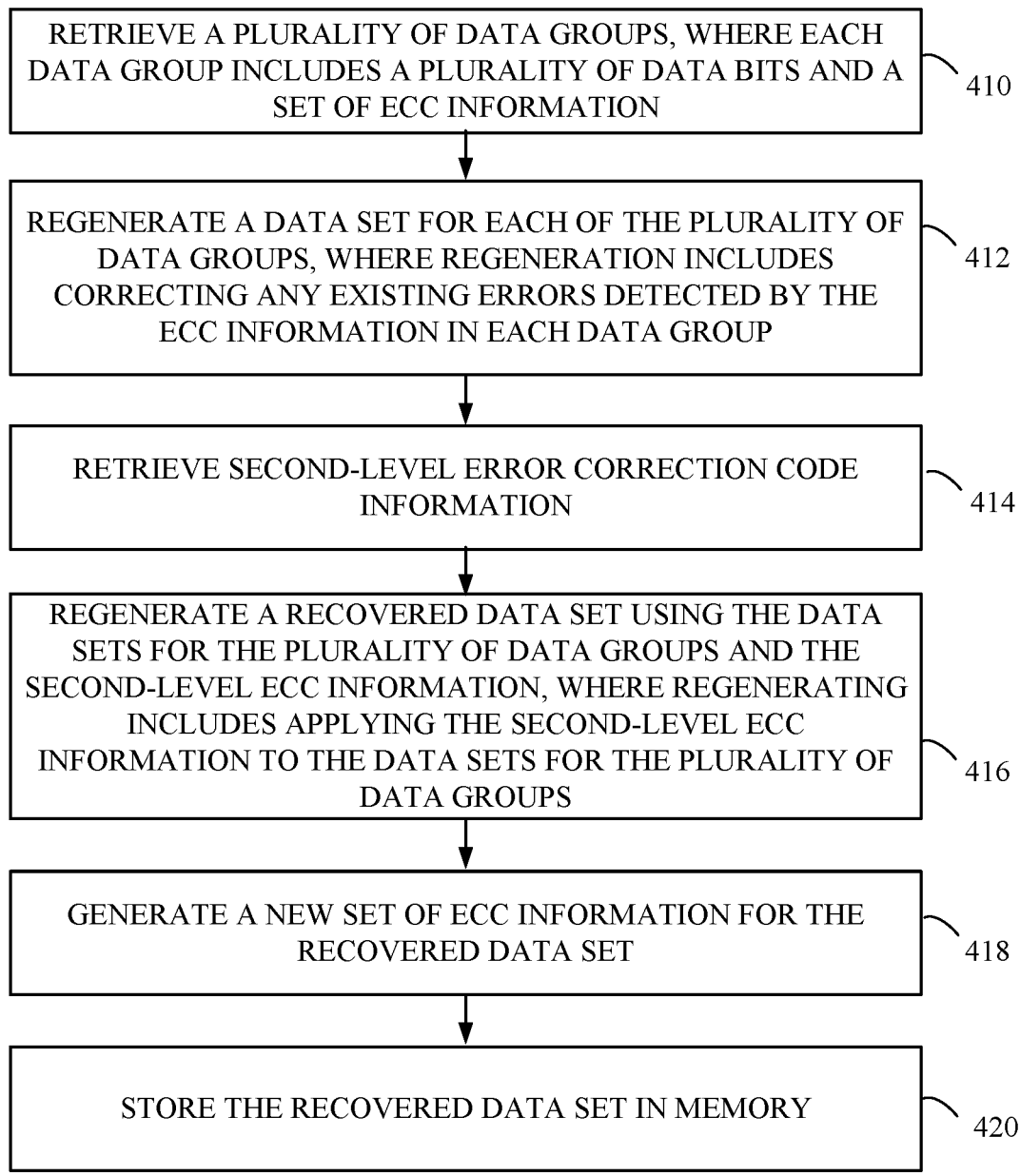
FIG. 7 is a flow chart illustrating a method for recovering data stored in memory cells in accordance with another exemplary embodiment.

FIG. 7 is a flow chart that illustrates an exemplary embodiment of a method of recovering preprogrammed data stored in memory cells in which two levels of ECC correction are performed. The operations included in the flow chart may represent only a portion of the overall process used in recovering the data. It should be appreciated that the method may include any number of additional or alternative tasks, the tasks shown in FIG. 7 need not be performed in the illustrated order unless specified otherwise, and the method may be incorporated into a more comprehensive procedure or process having additional functionality not described in detail herein. Moreover, one or more of the tasks shown in FIG. 7 can be omitted from an embodiment as long as the intended overall functionality remains intact.

FIG. 7 corresponds to a method for recovering preprogrammed data in which multiple levels of error correction are performed. At 410 a plurality of data groups are retrieved from nonvolatile memory, where each data group includes a plurality of data bits and a set of ECC information. In some embodiments, the plurality of data groups are stored in the free portion of magnetic memory devices included in one or more integrated circuits. In one embodiment, the plurality of data groups are distributed across multiple integrated circuits, where each of the integrated circuits may be a memory device included on a printed circuit board, which may be referred to as a memory module.

At 412 a data set for each of the plurality of data groups is regenerated, where regeneration includes correcting any existing errors detected by the ECC information included in each data group. Thus, the ECC information stored in each data group is used to correct errors within the plurality of data bits included in the same group. While applying the ECC information in each data group to the plurality of data bits stored in each data group provides a first level of error correction, the method of FIG. 7 adds a second level of error correction in order to improve the accuracy of the preprogrammed data recovery.

At 414 second-level error correction code information is retrieved from memory on the integrated circuit or in the system that includes multiple integrated circuits. In one example, the plurality of data groups retrieved at 410 are stored in a first set of memory devices, whereas the second-level ECC information retrieved at 414 is stored in one or more additional memory devices. In another example, the plurality of data groups are stored on memory devices in the system, whereas the second-level ECC information is stored in nonvolatile memory on a processor that is used to perform the second-level error correction operations.

At 416 a recovered data set is regenerated using the data sets for the plurality of data groups and the second-level ECC information. Regeneration at 416 includes applying the second-level ECC information to the data sets for the plurality of data groups. Thus, as was discussed with respect to FIG. 6, first-level ECC operations can be performed based on ECC information included with the individual data groups. Second-level ECC information can be stored either with the first-level ECC information or in separate integrated circuits, where the second-level ECC information is retrieved and applied to the data sets after the application of the first-level ECC information to the data included in the data groups.

Once the recovered data set has been assembled following the first- and second-level ECC correction, a new set of ECC information for the recovered data set is generated at 418. At 420 the recovered data set, as well as any new ECC information generated for the recovered data set, is stored in memory. As discussed above, the recovered data set can be stored back into one or more of the memory devices from which the plurality of data groups were retrieved, whereas in other embodiments, the recovered data set is stored in other memory. In a particular example, the recovered data set corresponds to code or other start-up formation used by a processor on power up. In such an example, the recovered data set can be stored in memory readily accessed by the processor, for example in volatile memory regularly accessed by the processor.

Figure 8:
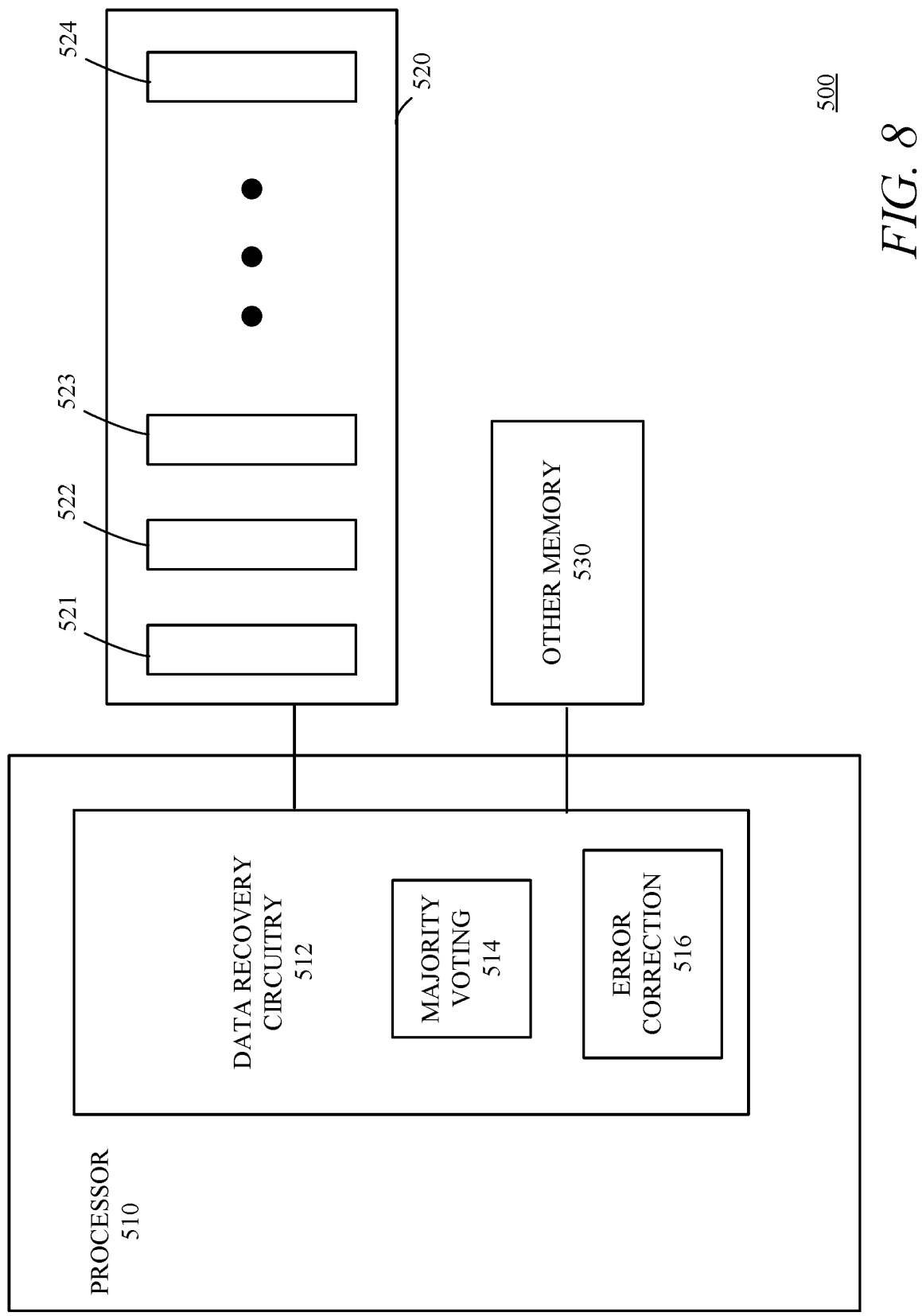
FIG. 8 is a block diagram of a system that performs recovery of preprogrammed data in accordance with another exemplary embodiment.

FIG. 8 illustrates a block diagram of a system 500 that includes a processor 510, a memory module 520, and other memory 530. In operation, preprogrammed data is stored on the memory module 520 which includes a plurality of memory devices 521-524. Each of the memory devices 521-524 includes nonvolatile memory, and in some embodiments, each of the memory devices 521-524 is a MRAM device. During testing operations or other manufacturing operations associated with the memory devices 521-524, data is preprogrammed into the memory devices 521-524 for later use by the processor 510. Exposure of the memory devices 521-524 to reflow soldering, magnetic fields, or other manufacturing operations after preprogramming can result in some data loss in the preprogrammed data. In order to promote full recovery of the preprogrammed data, redundant copies of the data and/or multiple levels of ECC correction can be employed.

The system 500 illustrated in FIG. 8 includes a processor 510 which is shown to include data recovery circuitry 512. In some embodiments, the data recovery circuitry 512 is separate and apart from the processor 510. For example, in some embodiments the data recovery circuitry 512 is included on the memory module 520. In order to recover the preprogrammed data stored in the memory module 520, the data recovery circuitry 512 retrieves a plurality of data groups from memory cells included in one or more of the memory devices 521-524. In some embodiments, the data recovery circuitry 512 employs majority voting circuitry 514 to perform majority voting operations with respect to multiple redundant copies of portions of the preprogrammed data. In other embodiments, each of the memories 521-524 includes its own majority voting circuitry, whereas in yet other embodiments, the memory module includes majority voting circuitry outside of the memory devices 521-524.

After retrieving the plurality of data groups from the memory cells, the data recovery circuitry 512 performs, using the error correction circuitry 516, first-level error correction on the data groups in order to regenerate a data set corresponding to each of the data groups. In other embodiments, the first-level ECC operations are performed on the individual memory devices 521-524. In some embodiments, majority voting and only a single level of error correction is performed in order to recover the preprogrammed data. In other embodiments, additional second-level error correction information is retrieved by the data recovery circuitry 512 and used to perform second-level error correction on the data sets resulting from the first-level error correction operations. Thus, some embodiments employ a two levels of error correction, where some of those embodiments may also include majority voting performed by the majority voting circuitry 514.

After recovering the preprogrammed data, additional ECC information can be generated for the recovered preprogrammed data, and then the preprogrammed data and ECC information is stored in memory. The recovered preprogrammed data can either be stored back into the memory module 520, or in other memory 530, which in some embodiments may be volatile memory such as DRAM or SRAM used by the processor 510 in normal operation. In yet other embodiments, the preprogrammed data is stored in other memory 530 that includes nonvolatile storage in which the preprogrammed data is expected to remain stable based on the manufacturing associated with system 500 being complete. In other words, because no further reflow soldering operations are performed once the system has been established, the recovery of the preprogrammed data using the techniques described herein need not be performed more than a single time where the resulting recovered data is stored in nonvolatile memory with the expectation that it will be preserved therein.

By storing multiple copies of preprogrammed data in non-volatile memory and/or using multiple levels of ECC correction, the preprogrammed data can be reliably recovered for known bit error rates that exist after operations such as solder reflow processing. For example, based on simulations performed, if a bit error rate of 2e-15 is the desired final bit error rate, first-level ECC operations alone can allow for a raw bit error rate of about 1e-6. In the simulations, double bit error correction with 128-bit data length in one ECC word was assumed, which is one of the typical schemes for on-chip ECC in conventional MRAM. Additional simulations show that by adding two redundant copies of the data and performing a majority voting for the bits in the data group before performing the ECC correction, the required raw bit error rate to achieve a final bit error rate of 2e-15 is between 1e-3 and 1e-4, which is a dramatic improvement. Adding fourth and fifth redundant copies for the majority voting reduces the needed raw bit error rate to between 1e-2 and 1e-3. Performing the first level ECC operations before majority voting does not provide quite as much improvement, but does provide significant improvement. With three copies of the data and ECC correction before majority voting, the raw bit error rate needed is reduced to 1e-4, and with five copies, the raw bit error rate is reduced to approximately 1e-3. In similar simulations, performing two levels of ECC correction reduced the required raw bit error rate to between 1e-3 and 1e-4 to achieve the desired final bit error rate of 2e-15. Further improvement to the raw bit error rate needed can be achieved in systems that use majority voting schemes based on additional redundant copies of the data with each additional pair of copies adding a smaller and smaller improvement.

By employing the preprogrammed data recovery and regeneration schemes described herein, memory cells such as magnetic memory cells can be designed to support reasonable switching voltages during normal operation while still providing a raw bit error rate after high temperature operations such as reflow soldering that allow preprogrammed data to be recovered following those operations. The various combinations of majority voting, first-level ECC operations, and second-level ECC operations provide a variety of techniques that can be used in different systems to achieve the desired result. Without the techniques described herein, the energy barrier for the free layer needs to be very high to avoid disturbance of the preprogrammed data during solder reflow, where such a high energy barrier results in a high switching voltage being required during normal operation. High switching voltages during normal operation can result in poor endurance properties and high write error rates in memory devices such as spin-torque MRAMs. The techniques provided herein support the use of MRAM as embedded memory in a wide range of potential applications.

Although the described exemplary embodiments disclosed herein are directed to various magnetoresistive-based devices, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method for recovering data stored in magnetic memory cells, comprising:
retrieving a first data group from the magnetic memory cells, wherein the first data group includes a first plurality of data bits and a first set of error correction code information;
retrieving a second data group from the magnetic memory cells, wherein the second data group includes a second plurality of data bits and a second set of error correction code information;
reading a third data group from the magnetic memory cells, wherein the third data group includes a third plurality of data bits and a third set of error correction code information;
after reading the first, second, and third data groups, generating a majority data group that includes a plurality of data bits and a set of error correction code information, wherein generating the majority data group includes:
for each bit in the plurality of data bits in the majority data group, determining the bit based on a majority voting scheme using a corresponding bit from each of the first, second, and third pluralities of data bits; and for each bit in the set of error correction code information in the majority data group, determining the bit based on the majority voting scheme using a corresponding bit from each of the first, second, and third sets of error correction code information, wherein each of the first, second, and third sets of error correction code information includes at least one parity bit, wherein each of the at least one parity bit represents at least one of an even or odd parity of the respective first, second, and third plurality of data bits; and regenerating a recovered data set using the majority data group, wherein regenerating includes correcting any existing errors detected by applying the set of error correction code information in the majority data group to the plurality of data bits in the majority data group.

2. The method of claim 1, further comprising generating a new set of error correction code information for the recovered data set.

3. The method of claim 2, further comprising storing the recovered data set and the new set of error correction information in memory.

4. The method of claim 1, further comprising storing the recovered data set in memory.

5. The method of claim 1, wherein each set of error correction code information includes Hamming code information.

6. The method of claim 1, wherein each set of error correction code information includes at least one of Reed-Soloman code information, Bose-Chaudhurin-Hocquenghem (BCH) code information, Low-Density Parity-Check (LDPC) code information, and Memory Signal Processing (MSP) code information.

7. The method of claim 1, further comprising:
retrieving additional data groups from the magnetic memory cells, wherein the additional pluralities of data bits and corresponding additional sets of error correction code information are used in generating the majority data group by including data bits and bits of error correction code information from the additional data groups in the majority voting schemes used to generate the majority data group.

8. A method for recovering data stored in magnetic memory cells, comprising:
retrieving a first data group from the magnetic memory cells, wherein the first data group includes a first plurality of data bits and a first set of error correction code information, wherein the first set of error correction code information includes at least one parity bit, wherein the at least one parity bit represents at least one of an even or odd parity of the first plurality of data bits;
regenerating a first data set using the first data group, wherein regenerating includes correcting any existing errors detected by applying the first set of error correction code information in the first data group to the first plurality of data bits in the first data group;
retrieving a second data group from the magnetic memory cells, wherein the second data group includes a second plurality of data bits and a second set of error correction code information, wherein the second set of error correction code information includes at least one parity bit, wherein the at least one parity bit represents at least one of an even or odd parity of the second plurality of data bits;
regenerating a second data set using the second data group, wherein regenerating includes correcting any existing errors detected by applying the second set of error correction code information in the second data group to the second plurality of data bits in the second data group;
reading a third data group from the magnetic memory cells, wherein the third data group includes a third plurality of data bits and a third set of error correction code information, wherein the third set of error correction code information includes at least one parity bit, wherein the at least one parity bit represents at least one of an even or odd parity of the third plurality of data bits;
regenerating a third data set using the third data group, wherein regenerating includes correcting any existing errors detected by applying the third set of error correction code information in the third data group to the third plurality of data bits in the third data group; and
after regenerating the first, second, and third data sets, generating a majority data set that includes a plurality of data bits, wherein generating the majority data set includes:
for each bit in the plurality of data bits in the majority data set group, determining the bit based on a majority voting scheme using a corresponding bit from each of the first, second, and third data sets.

9. The method of claim 8, further comprising generating a new set of error correction code information for the majority data set.

10. The method of claim 9, further comprising storing the majority data set and the new set of error correction information in memory.

11. The method of claim 8, further comprising storing the majority data set in memory.

12. The method of claim 8, wherein each set of error correction code information includes Hamming code information.

13. The method of claim 8, wherein each set of error correction code information includes at least one of Reed-Soloman code information, Bose-Chaudhurin-Hocquenghem (BCH) code information, Low-Density Parity-Check (LDPC) code information, and Memory Signal Processing (MSP) code information.

14. The method of claim 8, further comprising:
reading additional data groups from the magnetic memory cells, wherein each of the additional data groups includes a plurality of data bits and a set of error correction code information, wherein the set of error correction code information includes at least one parity bit, and wherein the at least one parity bit represents at least one of an even or odd parity of the plurality of data bits;
regenerating, for each additional data group, a data set using the data group, wherein regenerating includes correcting any existing errors detected by applying the set of error correction code information in the additional data group to the plurality of data bits in the additional data group; and
wherein, generating the majority data set includes, for each bit in the plurality of data bits in the majority data group, determining the bit based on a majority voting scheme using a corresponding bit from each of the first, second, and third pluralities of data sets as well as a corresponding bit from each of the data sets corresponding to the additional data groups.

* * * * *